(12) United States Patent
Powell (10) Patent No.: US 11,252,369 B2
(45) Date of Patent: Feb. 15, 2022

(54) FAST MULTI-SAMPLING IN IMAGE SENSORS

(71) Applicant: SHENZHEN GOODIX TECHNOLOGY CO., LTD., Shenzhen (CN)

(72) Inventor: Matthew Powell, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 193 days.

(21) Appl. No.: 16/839,050

(22) Filed: Apr. 2, 2020

(65) Prior Publication Data

US 2021/0314510 A1  Oct. 7, 2021

(51) Int. Cl.
*H04N 5/378* (2011.01)
*H04N 5/93* (2006.01)
*H04N 5/932* (2006.01)

(52) U.S. Cl.
CPC ............. *H04N 5/378* (2013.01); *H04N 5/932* (2013.01)

(58) Field of Classification Search
CPC ...... H04N 5/378; H04N 5/932; H04N 5/3575; H03M 1/1295; H03M 1/145; H03M 1/56
See application file for complete search history.

(56) References Cited

U.S. PATENT DOCUMENTS

| | | | |
|---|---|---|---|
| 2012/0033097 A1* | 2/2012 | Lim ..................... | H04N 5/3765 348/222.1 |
| 2013/0062503 A1* | 3/2013 | Saito .................... | H04N 5/3575 250/208.1 |
| 2015/0189209 A1* | 7/2015 | Yang ...................... | H04N 5/378 348/300 |
| 2016/0100115 A1* | 4/2016 | Kusano .............. | H04N 5/37455 250/208.1 |
| 2016/0165166 A1* | 6/2016 | Koh ...................... | H04N 5/3575 348/302 |
| 2017/0162619 A1 | 6/2017 | Chou et al. | |
| 2018/0295301 A1* | 10/2018 | Lee ....................... | H04N 5/3454 |
| 2019/0109599 A1* | 4/2019 | Matsuzawa ............ | H04N 5/378 |
| 2019/0123754 A1* | 4/2019 | Yeh ......................... | H04N 5/378 |
| 2020/0036925 A1* | 1/2020 | Cho ....................... | H04N 5/3658 |
| 2020/0322557 A1* | 10/2020 | Shim .................... | H04N 5/3765 |

FOREIGN PATENT DOCUMENTS

CN   109792499 A   5/2019

* cited by examiner

Primary Examiner — Nhan T Tran
(74) Attorney, Agent, or Firm — Kilpatrick Townsend & Stockton LLP (57) ABSTRACT

A readout circuit includes a ramp generator for generating a plurality of first short ramps having a first level in a reset conversion phase and a plurality of second short ramps having a second level greater than the first level and a full-scale ramp having a third level greater than the second level in a signal conversion phase, a comparator for comparing a first analog signal with each one of the first short ramps to obtain a plurality of first comparison results in the reset conversion phase, and comparing a second analog signal with each one of the second short ramps and the full-scale ramp in the signal conversion phase to generate a plurality of second comparison results and a third comparison result, and a controller configured to determine an output signal value of the second analog signal according to the plurality of second comparison results and the third result.

20 Claims, 9 Drawing Sheets

FAST MULTI-SAMPLING IN IMAGE SENSORS

TECHNICAL FIELD

The present invention relates to the field of integrated-circuit image sensors. More particularly, the present invention discloses a correlated multiple sampling architecture in an integrated-circuit image sensor using short and fast ramps.

BACKGROUND

Modern image sensors with high pixel count attempt to achieve high frame rate, low read noise and high dynamic range with minimal power consumption. The basic function of a modern CMOS image sensor (CIS) is to capture photons that are converted into electrons in a photo diode. These captured electrons are read out by a series of analog-to-digital converters (ADCs) included as part of the image sensor. In the readout chain, higher power can provide lower read noise or higher dynamic range, which result in improved image quality. But higher power consumption also results in shorter battery lifetimes and thermal heating, which have intrinsic limits in consumer products and can lead to worse sensor performance in the context of CIS. Finding architectures that can reduce the read noise or increase the dynamic range for the same power consumption and frame rate yields a substantial performance advantage.

BRIEF SUMMARY OF THE INVENTION

The present invention discloses an integrated-circuit image sensor including a correlated multiple sampling architecture using short and fast ramps. According to an aspect, the inventive concept is directed to improving read noise by performing multiple ADC conversions in both the reset conversion phase and the signal conversion phase. By averaging the output results from these conversions, the net result is a reduction in thermal noise. The present invention provides an improved high performance and low noise image sensor by terminating the voltage ramp very early on, only enough to convert signals representing a certain number of electrons (photons). This results in a substantial savings of time for the additional ADC conversions. Furthermore, since one conversion still covers the full readout range of the pixel, there are no negative effects or penalty in the dynamic range of the image sensor.

According to another aspect, the correlated multiple sampling architecture further includes a programmable gain amplifier (PGA) that provides good linearity and programmable gain. With the PGA the benefit of a short correlated multiple sampling is even greater as the programmable gain provides flexibility to increase the ramp rate. While increasing the ramp rate will only effect the noise contribution per conversion from the ADC, that contribution is reduced by the gain from the PGA. The extra conversions, however, will provide a reduction in thermal noise from both the ADC and the PGA. A corresponding method of reading out the signals of a pixel or all pixels of the image sensors is also disclosed.

These and other embodiments of the present invention along many of its advantages and features are described in more detail in conjunction with the text below and attached figures.

BRIEF DESCRIPTION OF THE DRAWINGS

The drawings are not necessarily to scale, emphasis is placed on illustrating the principles of the inventive concepts. For example, the dimensions of some of the elements are exaggerated relative to each other for clarity.

DETAILED DESCRIPTION OF THE INVENTION

Figure 1:
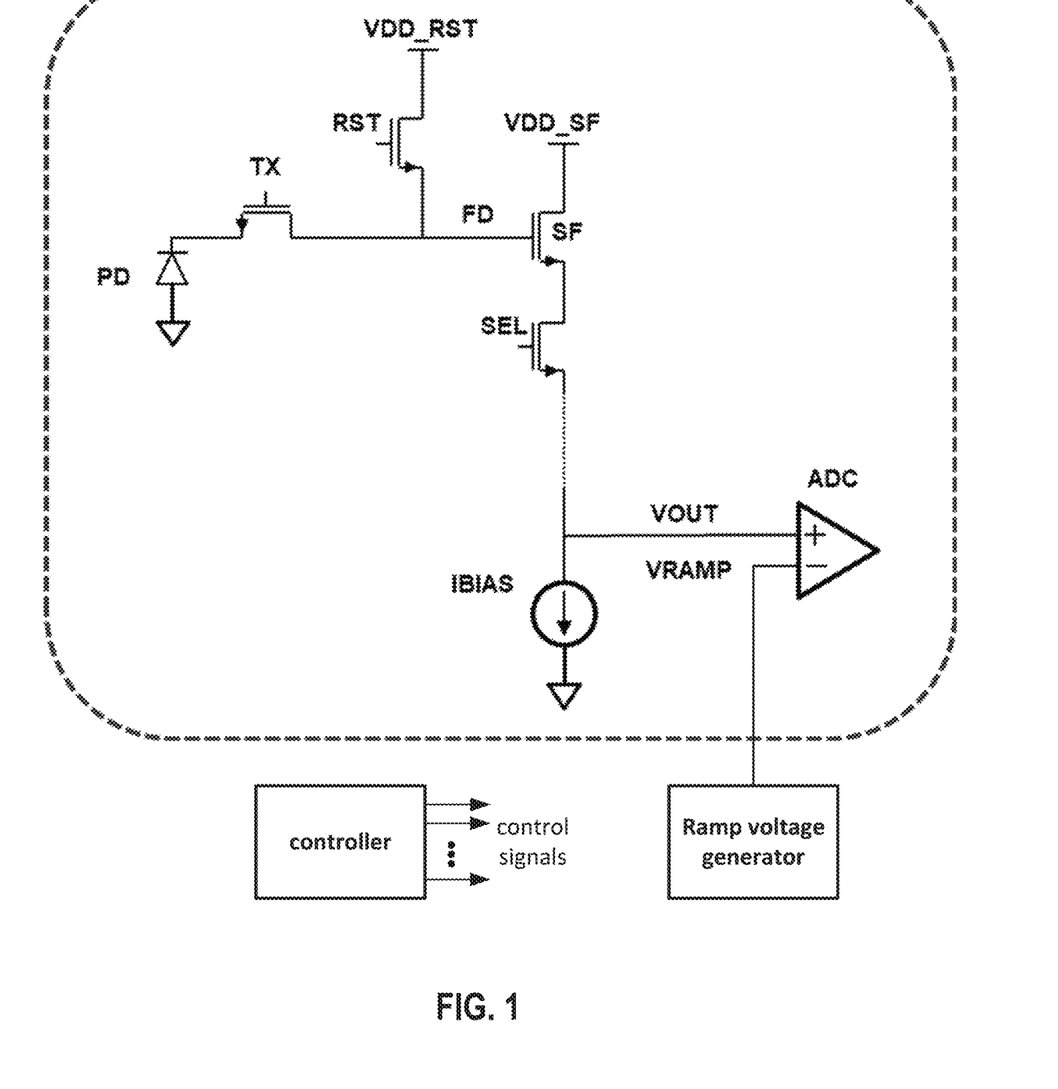
FIG. 1 is a block diagram of a pixel coupled to an example readout circuit according to an embodiment of the present disclosure.

FIG. 1 is a block diagram of a pixel coupled to an example readout circuit according to an embodiment of the present disclosure. Referring to FIG. 1, the pixel includes a photodiode (or a photosensitive element) PD, a transfer transistor TX coupled to the photodiode PD, a source follower SF having a gate coupled to the transfer transistor TX, a reset transistor RST coupled to a floating diffusion node FD disposed between the transfer transistor TX and the gate of the source follower SF. The reset transistor RST is configured to charge the floating diffusion node FD to the reset voltage VDD_RST when the reset transistor RST is turned on, thereby resetting the floating diffusion node FD. The photodiode PD may be reset along with the floating diffusion node FD by turning on the transfer transistor TX. The source follower SF has a terminal coupled to the source follower voltage VDD_SF and another terminal coupled to a select transistor SEL. The select transistor SEL has a gate coupled to a row select line (not shown) and is disposed between the source follower SF and a voltage readout line that provides an analog output pixel signal VOUT to an analog-to-digital converter ADC. The select transistor SEL is coupled to a current source IBIAS. In one embodiment, the transfer transistor TX, the reset transistor RST, the source follower SF, and the select transistor SEL are NMOS transistors.

In one embodiment, the analog-to-digital converter ADC includes a comparator and a counter and receives a ramp voltage VRAMP from a ramp voltage generator. As used herein, the ramp voltage generator may be referred to as ramp generator. The ramp voltage VRAMP may also be referred to as ramp, ramp signal, or ramp voltage signal. The ramp voltage VRAMP increase with time at a constant rate. Referring to FIG. 1, the readout circuit may also include a controller configured to generate control signals to turn on and off the transfer transistor TX, the reset transistor RST, the source follower SF, and the select transistor SEL. The controller also provides control signals to the ramp voltage generator for controlling the ramp voltage VRAMP during different time intervals in the reset conversion phase and in the signal conversion phase (alternatively referred to as signal measurement phase). In one embodiment, the controller can be implemented as a separated device disposed outside the readout circuit. In another embodiment, the controller can be integrated in the image sensor including an array of pixels and a plurality of readout circuits. The ramp voltage generator provides a ramp voltage to the readout circuits. The ADC, the controller, and the ramp voltage generator will be described in more detail below.

Figure 2:
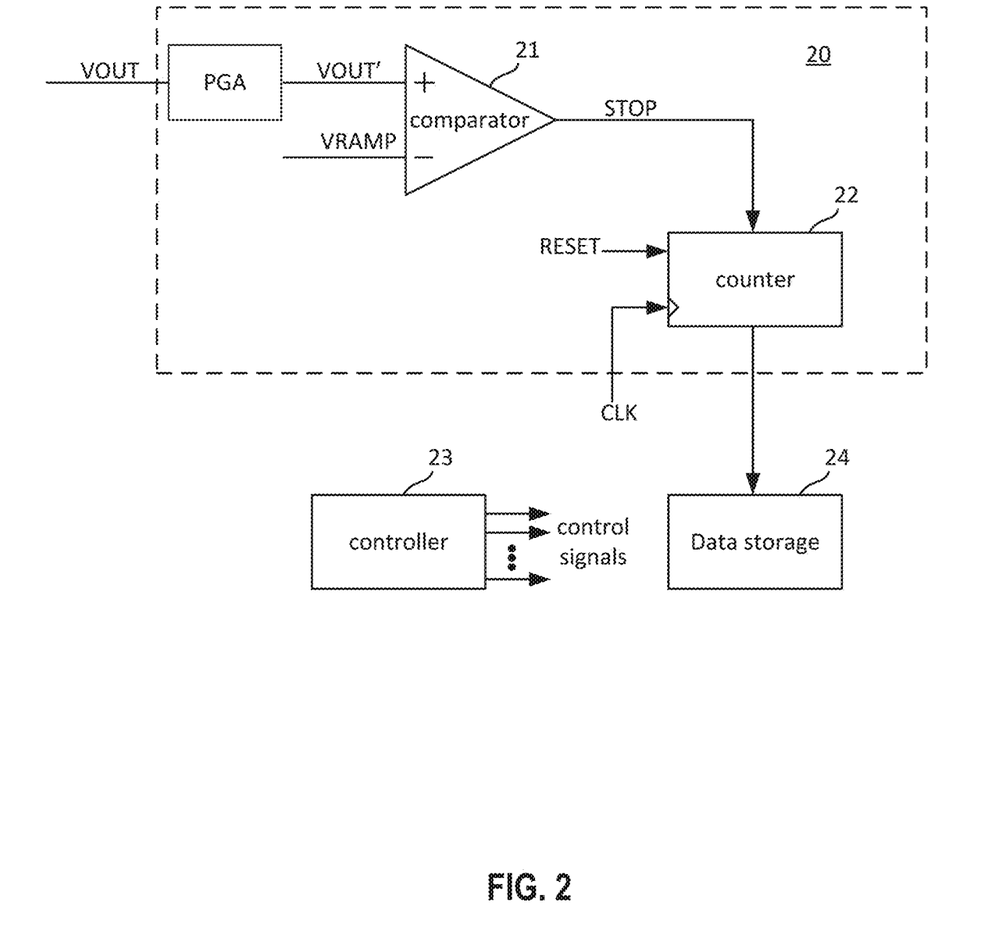
FIG. 2 is a simplified block diagram of an analog-to-digital converter according to an embodiment of the present disclosure.

FIG. 2 is a simplified block diagram of an analog-to-digital converter (ADC) 20 according to an embodiment of the present disclosure. The analog-to-digital convert 20 includes a voltage comparator 21 and a counter 22 coupled to the comparator 21. The counter 22 receives a reference clock signal CLK and a reset signal RESET. The counter 22 counts in response to the reference clock signal CLK while the comparator 21 compares the pixel output signal VOUT with the ramp voltage VRAMP. When the ramp voltage VRAMP reaches or exceeds the level of VOUT, the comparator 21 outputs a comparison signal STOP to the counter 22. In response, the counter 22 stops counting and the count value stored in the counter is a digital word that represents the pixel output signal VOUT. Referring to FIG. 2, a controller 23, in additional to provide control signals to turn on and off the transistors to readout analog signals of pixels of an image sensor, also outputs control signals to latch the count value stored in the counter 22 to a data storage 24, transfer the count value to a processor (not shown) for further processing, and reset the counter 22. In one embodiment, the counter 22 may be a synchronous counter. In another embodiment, the counter 22 may be a binary ripple counter.

In one embodiment, the ADC 20 may further include a programmable gain amplifier (PGA) disposed before the comparator 21, i.e., the PGA is disposed between the pixel output signal VOUT and the comparator and adds a programmable gain to the pixel output signal VOUT prior to providing the amplified (scaled) pixel output signal VOUT' to the comparator 21. The PGA provides the flexibility to increase the ramp rate of the ramp signal VRAMP. The increase in the ramp rate allows additional analog-to-digital conversions that provide the benefit of a reduction in thermal noise from both the ADC and the PGA. It is noted that, while increasing the ramp rate will only effect the noise contribution per conversion from the ADC, that contribution is reduced by the gain from the PGA.

In one embodiment, an ADC architecture in high pixel count image sensors is a ramp ADC. In a ramp ADC a single linear slope voltage ramp is provided to many ADCs (usually thousands) along with a reference clock (e.g., clock signal CLK). Each ADC contains a comparator to compare the voltage output from the pixel to the ramp voltage. Each ADC also contains a digital circuit (e.g., counter 22) to count clock cycles. Each ADC captures the number of clock cycles from the start of the ramp to the moment that the ramp voltage reaches or exceeds the pixel output voltage. The benefit of this architecture is that each of many instances of the ADC only needs to include a simple comparator and a digital counter. The ramp generator circuit has many more components and considerable power consumption compared to the comparator in each ADC, but only one of them is needed for the entire image sensor so the overall area and power requirement for the ramp generator is a small fraction of the total ADC area and power.

In one embodiment, the number of ADCs is chosen so that some number of rows, or a fraction of rows, of the image sensor can be read out at a single time. In an example embodiment, an image sensor may have 8000 pixels in a single row and 4000 ADCs, each of the ADCs is coupled to a column, thus half of the pixels in a row can be read out at a time. In order to read out a frame, each set of rows, or fraction of rows, is read out sequentially. In the example embodiment with 8000 pixels in a row and 4000 ADCs, the image sensor may have 6000 rows (i.e., 6000 pixels in a column), then 12000 sequential ADC conversions are needed to read out the entire image frame. The frame rate of the image sensor is limited by how fast these 12000 sequential conversions can be performed.

An additional common property of high pixel-count image sensors is that an ADC conversion is performed first when the pixel is in a reset state and a second ADC conversion is performed after the electrons are transferred from the photodiode to a small capacitor and converted into a voltage. The signal based on the electric charges of the pixel is considered as the difference between the two ADC conversions. This approach is very beneficial for addressing impairments, such as kT/C noise of the reset conversion, offset in the pixel readout circuit or ADC and 1/f noise in the system. It is generally mandatory in some form for acceptable performance in image sensors targeting read noise performance at the level of 1-3 electrons. The reset phase is initiated by applying a pulse to a reset gate which returns the voltage on a node in the pixel to a reset state. The signal measurement phase is initiated by applying a pulse to a TX gate which transfers electrons from the photodiode to this same node.

Figure 3:
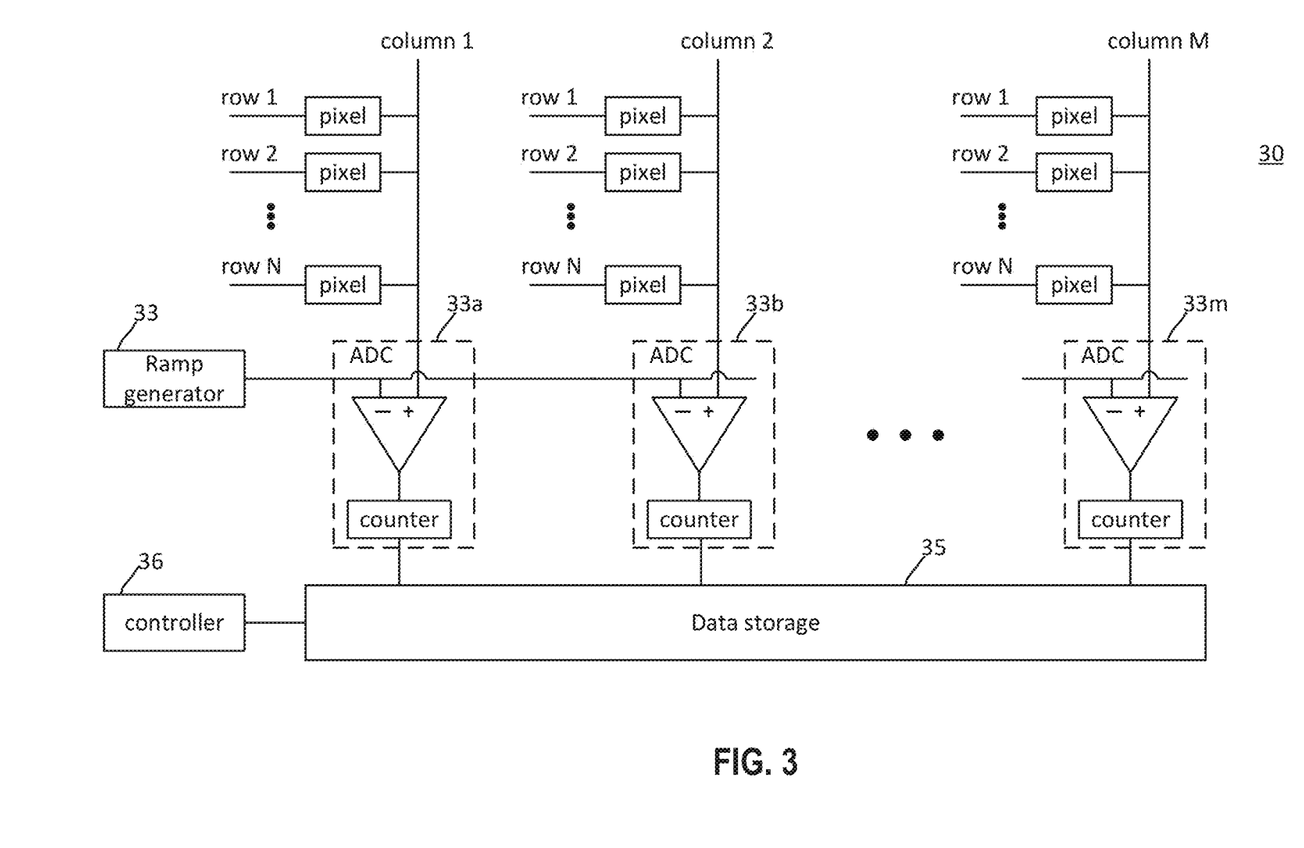
FIG. 3 is a simplified schematic block diagram illustrating an analog-to-digital conversion in an image sensor according to an embodiment of the present disclosure.

FIG. 3 is a simplified schematic block diagram illustrating an analog-to-digital conversion in an image sensor 30 according to an embodiment. Referring to FIG. 3, the image sensor 30 includes a pixel array having N rows of pixels and M columns of pixels, each column is coupled to one of the analog-to-digital converters (ADCs) 33a, 33b, . . . , 33m. Each of the ADCs may include a comparator and a counter as shown in FIG. 2. The counters each receive a common clock signal CLK and includes a count value corresponding to an analog pixel signal received from a pixel of an associated column. The count value of each counter is latched into a data storage 35 in response to control signals provided by a controller 36. In some embodiments, the number of ADCs is less than the number of columns in the pixel array such that the ADCs are sequentially shared by the columns.

One concept to improve read noise is to perform multiple ADC conversions in both the reset and signal conversion phases. By averaging the output results from these conversions, the net result is a reduction in thermal noise to signal ratio proportional to the square root of the number of additional conversions. The downside of this approach is that the time for pixel conversions grows proportionally with the number of conversions performed so this approach has both a reduction in frame rate and an increase in the total energy for each frame capture.

One interesting property of image sensors is that the photon arrival rate is a Poisson process which has a shot noise with power equal to the average photon arrival rate. The same is true of the captured electrons. The shot noise in voltage is equivalent to the square root of electrons. The significance of this is that the read noise of the ADC can be relaxed substantially for pixels with higher numbers of captured electrons. For example, for an ADC with 1 electron of read noise, the shot noise and the read noise are equal for pixels with an average electron capture rate of 1 electron per exposure. But for pixels with an average electrons capture rate of 100 electrons, the shot noise increases to 10 electrons. This allows for significant relaxation of the ADC read noise without any significant impact to the total noise of the measurement.

Figure 4:
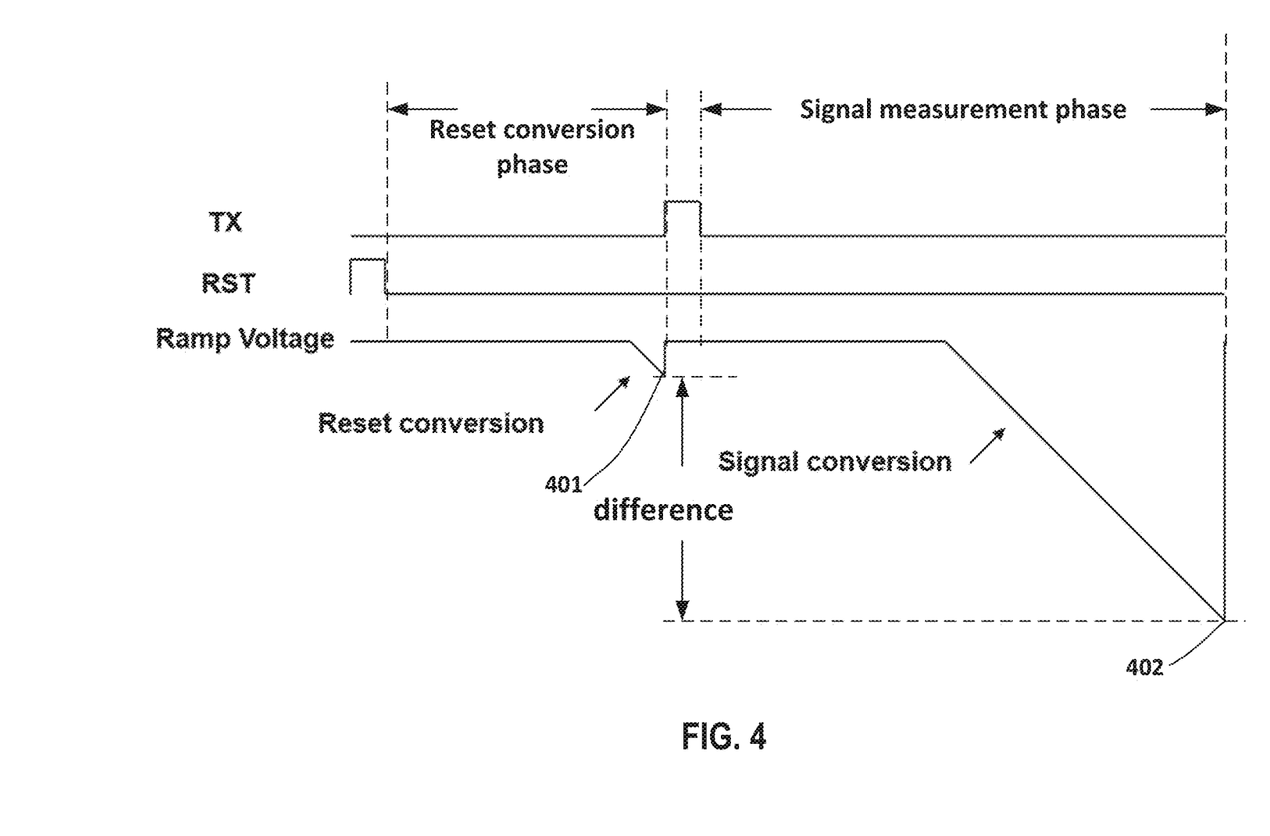
FIG. 4 is a timing diagram illustrating an exemplary pixel readout cycle for describing the basic pixel readout of FIG. 1.

FIG. 4 is a timing diagram illustrating an exemplary pixel readout cycle for describing the basic pixel readout circuit of FIG. 1. Referring to FIG. 4, when the reset transistor RST is turned on (RST signal is asserted high), the floating diffusion node FD is charged with the VDD_RST voltage. The reset transistor RST is then turned off (RST signal is asserted low), the value 401 obtained during the reset conversion phase represents the effective value of noise of the readout circuit. When the transfer transistor TX is turned on (TX signal is asserted high), an analog pixel signal 402 indicative of the photons received by the pixel is received by the readout circuit. The transfer transistor TX is then turned off (TX signal is asserted low). The analog pixel signal is then measured during the signal conversion phase (signal measurement phase). The difference between the pixel signal 401 in the reset conversion phase and the pixel signal 402 in the signal measurement phase represents the effective voltage value of the analog pixel signal with the noise values of the readout circuit being subtracted from the measured analog pixel signal value.

One inventive concept of the present invention is to perform multiple ADC conversions in the reset conversion phase and in the signal conversion phase, but for the extra conversions in the signal conversion phase to terminate the voltage ramp very early on—only enough to convert signals representing, e.g., 100 electrons or fewer read out from the pixel photodiode. This results in a substantial savings of time for the extra ADC conversions and since one conversion still covers the full readout range of the pixel, there are no negative effects and penalty in the dynamic range of the conversion.

The property of a ramp ADC is that the noise referred to pixel output voltage is proportional to the square root of the ramp rate. Thus, if the pixel is to be read out in the same amount of time while performing additional conversions, the ramp rate has to be increased, which will drive a related increase in noise. If the ramp rate is increased by 2× so that the number of conversions can be increased by 2×, the benefit from the number of conversions increase will be cancelled by the penalty in the ramp rate increase.

A typical large pixel CIS is used for describing an example ramp ADC of the inventive concept with a normal ramp rate of 1 V/μs and the maximum output voltage swing from the pixel is 1 V. Then the full range of the pixel is required to be read out in 1 μs. Suppose the 1 V output swing is determined by a pixel with a maximum electron count of 10000 and with a conversion gain of 100 μV/electron, so that each electron adds an extra 100 μV to the output. In this case, reading out 100 electrons only requires a ramp voltage swing of 10 mV, which is quite small compared to the full swing. Practically speaking, there will be some overhead requirements such that a minimum ramp of 100 mV is required. Thus, three extra conversions can be obtained with only an addition of 300 ns increased conversions time. Alternatively, the ramp rate can be increased to 1.3 V/μs, and the benefit of 2× reduction in thermal noise (2 equals the square root of 4) can be obtained with a per conversion noise increase of only 1.14× (square root of 1.3).

Figure 5:
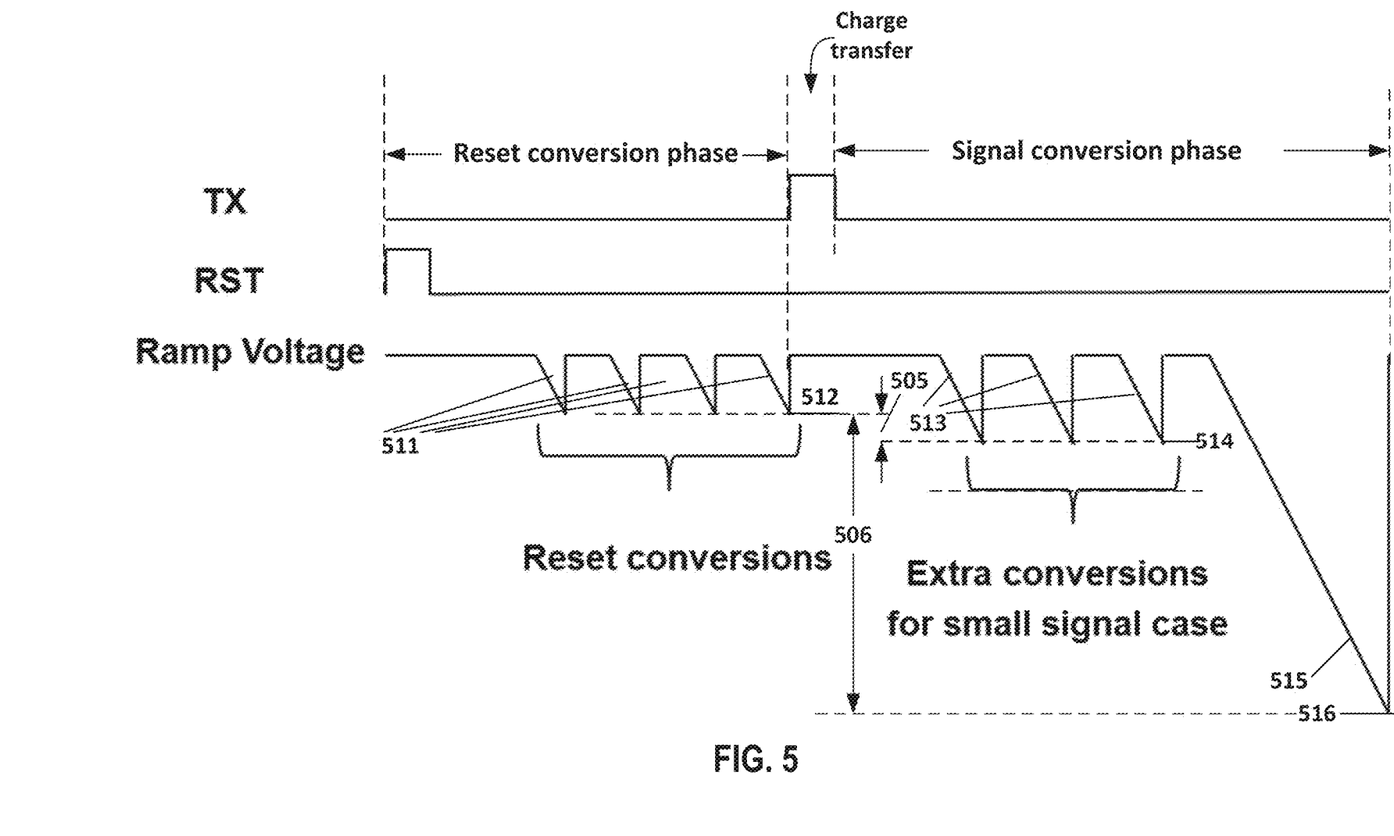
FIG. 5 is a timing diagram illustrating an exemplary pixel readout cycle of FIG. 1 for describing a pixel readout of FIG. 1 according to an embodiment of the present disclosure.

FIG. 5 is a timing diagram illustrating an exemplary pixel readout cycle for describing a pixel readout of the readout circuit of FIG. 1 according to an embodiment of the present disclosure. Referring to FIG. 1, FIG. 2, and FIG. 5, when the reset transistor RST is turned on (RST signal is asserted high), the floating diffusion node FD is charged with the VDD_RST voltage. Then the reset transistor RST is turned off (RST signal is asserted low). In the reset conversion phase, the ramp voltage generator provides a plurality of first short ramps 511 having a first magnitude (first level) 512, and the comparator compares the first analog signal stored in the floating diffusion node FD with each of the plurality of first short ramps to obtain a plurality of first comparison results. Thereafter, the transfer transistor TX is turned on (TX signal is asserted high), the charge in the photodiode is transferred to the floating diffusion node FD, and the source follower SF provides the charge as a second analog signal (e.g., the analog output signal) VOUT to the ADC when the SEL transistor is turned on. In the signal conversion phase, the ramp voltage generator provides a plurality of second short ramps 513 having a second magnitude (second level) 514 and a full-scale ramp 515 having a third magnitude (third level) 516, the comparator compares the second analog signal with each of the second short ramps 513 and with the full-scale ramp 515 to obtain a plurality of second comparison results and a third comparison result. The controller determines an output signal according to the second comparison results and the third comparison result. In one embodiment, the first level may correspond to a voltage level of 1 to 3 electrons (photons), the second level may correspond to a voltage level of 100 electrons, and the third level may correspond to a voltage level of 10000 electrons.

When the third comparison result is determined to be positive, i.e., the third comparison result is present, the controller determines that the second analog signal is a bright-level signal. When the third comparison result is determined to be negative, i.e., the third comparison result is not present in the signal conversion phase, the controller determines that the second analog signal is a dark-level signal.

Referring to FIGS. 2 and 5, in the reset conversion phase, the time for the first short ramps 511 to reach the first analog signal (i.e., noise) received from the floating diffusion node FD is measured by means of the digital counter 22, which counts the number of the reference clocks CLK until it receives the STOP signal from the comparator 21 (when the VRAMP signal reaches or exceeds the first analog signal VOUT). The count value of the digital counter 22 is then stored in the data storage 24 under control of the controller 23, the digital counter 24 is then reset and ready for the next counting operation. In the signal conversion phase, the time for the second short ramps 513 to reach or exceed the second analog signal (e.g., the signal level associated with 100 electrons) is again measured by the digital counter 22 (when the VRAMP signal reaches or exceeds the second analog signal). The count value is then stored in the data storage 24 under control of the controller 23. The digital counter restarts its counting operations to obtain a plurality of second comparison results. Similarly, still in the signal conversion phase, the time for the full-scale ramp 515 to reach the third analog signal (e.g. the signal level associated with 10000 electrons) is again measured by the digital counter 22, and the third comparison result is then stored in the data storage 24. It is understood that the number of first short ramps 511, the number of second short ramps 513, and the number of the third full-scale ramp 515 can be any integer number N. In the example shown in FIG. 5, four first short ramps 511, three second short ramps, and one full-scale ramp are shown, but it is understood that the number is arbitrary chosen for describing the example embodiment and should not be limited.

In one embodiment, the controller 23 computes an average value of the plurality of first comparison results to obtain a first average value 512 and an average value of the plurality of second comparison results to obtain a second average value 514. The controller 23 further determines whether the second analog signal is greater than the second level of the second short ramps. In the event that the second analog signal is greater than the second level, the controller determines that the third comparison result includes a bright-level signal (e.g., the photodiode has accumulated a number of electrons greater than 100 electrons) and computes a difference 506 between bright-level signal and the first average value. The difference is associated with the number of electrons accumulated in the photodiode without the readout noise (including the offset of the comparator). In the event that the second analog signal is not greater than the second level, the controller computes a difference 505 between the second average value 514 and the first average value 512 and provides this difference to a processor for further processing. That is, the controller may include arithmetic operators for computing the average of the first comparison results and the second comparison results. In other embodiments, these operations may be performed by a processor external to the controller.

In one embodiment, the controller may determine that the second analog signal is greater than the second level by evaluating the third comparison result (the third full-scale ramp 515). In one embodiment, the controller may determine that the second analog signal is greater than the second level through some indication that the count result for one of the short ramps 513 in the signal conversion is invalid either by the fact that the ADC comparator never trips during the ramp time, the result is saturated, or the result exceeds some limit that should be considered valid for this ramp duration.

In one embodiment, the controller may determine that the second analog signal is smaller enough to use all the second comparison results, and the second analog signal is only above a certain level (e.g., 120 electrons) or a percentage (e.g., 10 percent) above the second level, the controller computes the average of the second and third comparison results.

In one embodiment, the controller may determine that the second analog signal is greater than the second level by utilizing any of the approaches described above, the controller computes the final third comparison result by multiplying the third comparison result by the number of the first comparisons in the reset conversion phase. This embodiment corresponds to the approach utilizing a digital gain change. Of course, one skilled in the art will understand that other arithmetically equivalent method with linear gain change may be utilized.

Figure 6A:
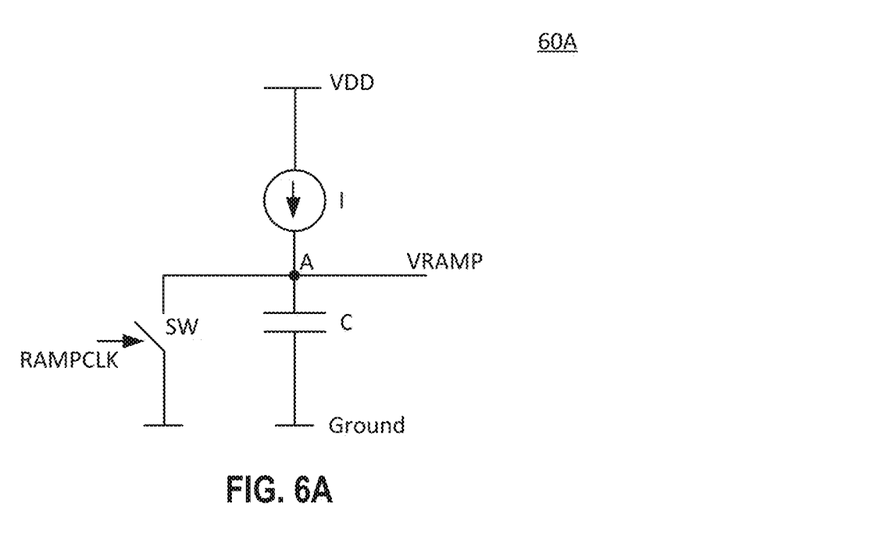
FIG. 6A is a circuit diagram of a ramp generator that can be employed in an embodiment of the present disclosure.

FIG. 6A is a block circuit diagram of a ramp generator 60A that can be employed in an embodiment of the present disclosure. Referring to FIG. 6A, the ramp generator 60A includes a constant-current source labeled I and connected between a positive voltage supply VDD and an output node A, a capacitor C is connected between the output node A and ground, and a switch SW is connected in parallel with the capacitor C. The switch SW is open and closed under the control of a control signal RAMPCLK.

Figure 6B:
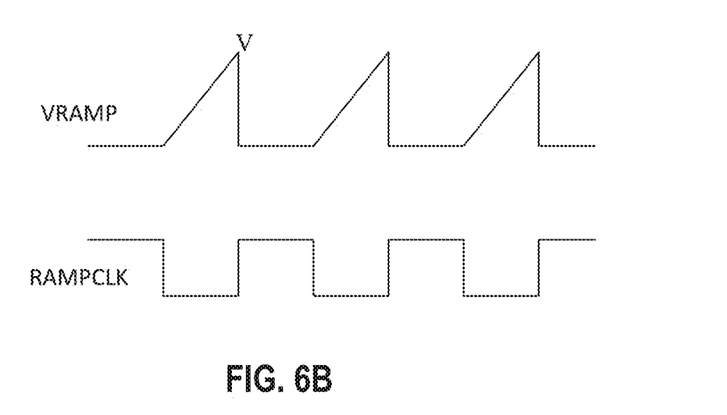
FIG. 6B is an output voltage waveform of the ramp generator of FIG. 6A.

FIG. 6B is an output voltage waveform of the ramp generator of FIG. 6A. When the switch SW is open, the capacitor C is charged by the constant-current source I and provides a voltage VRAMP increasing linearly to a level V, which is a function of the capacitive value of the capacitor C and the current value of the constant-current source I. The voltage VRAMP is discharged to zero when the switch SW is closed. In one embodiment, the switch SW is an NMOS transistor and is turned on when the RAMPCLK signal is asserted high. The level V can be controlled or adjusted by varying the duration of the successive opening and closing of the switch SW. The ramps have the same ramp rate independent of the ramp time periods. It is noted that the voltage VRAMP is shown as linearly increasing from a low level to a high level, one of skill in the art would appreciated that the voltage VRAMP can have its polarity inverted using circuitry known in the art, such as operational amplifiers, field effect transistors, and the like.

Figure 7:
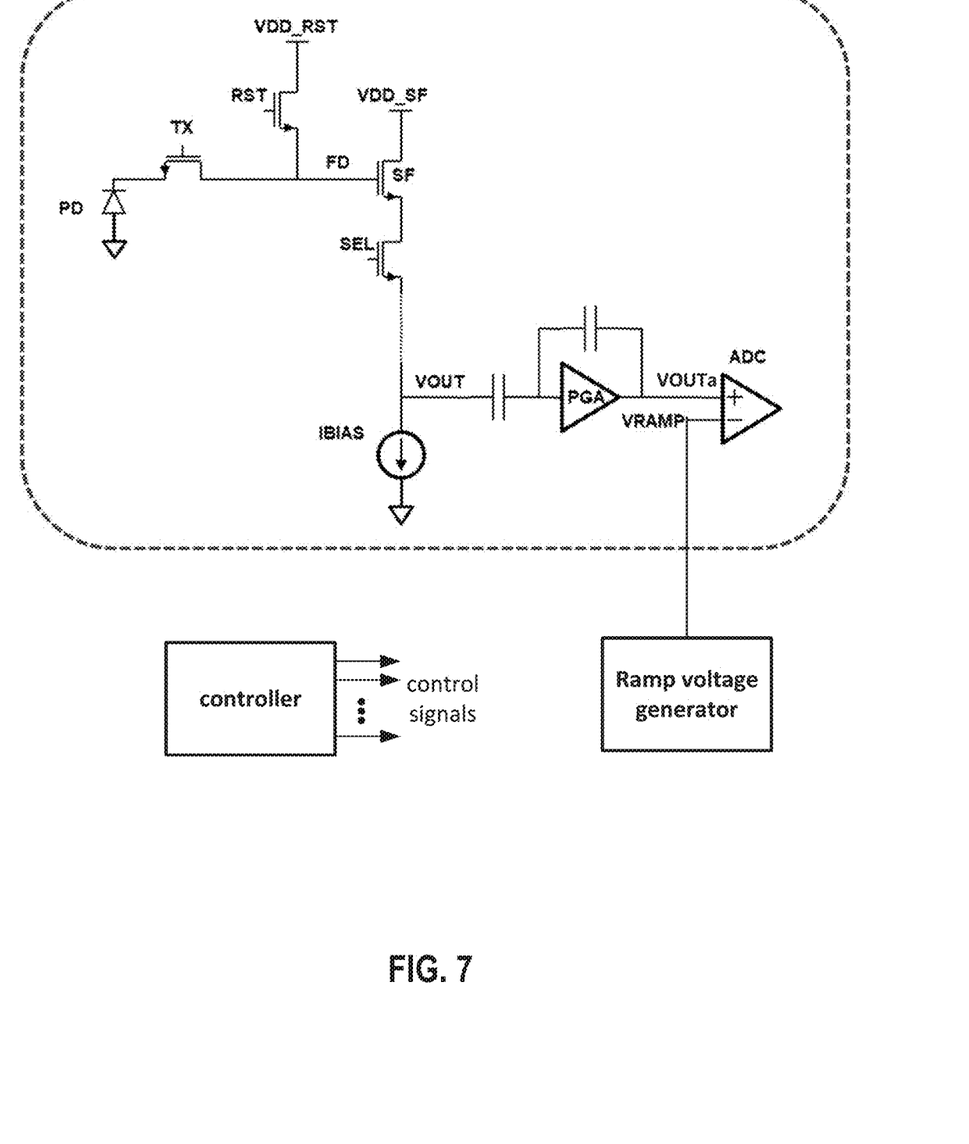
FIG. 7 is a block diagram of a pixel coupled to an example readout circuit according to another embodiment of the present disclosure.

FIG. 7 is a block diagram of a pixel coupled to an example readout circuit 70 according to another embodiment of the present disclosure. The readout circuit 70 is similar to the one shown in FIG. 1 with the exception that a programmable gain amplifier PGA is disposed before the ADC and configured to provide an amplified analog signal VOUTa of the analog signal VOUT received from the floating diffusion node FD to the ADC. In one embodiment, the programmable gain can be provided by utilizing different valued capacitors switched in parallel. In another embodiment, the programmable gain can be provided by different valued resistors in the series resistor and in the feedback resistor. The ADC may have a comparator and a digital counter similar to the structure shown and described in FIG. 2. Of course, one skilled in the art will understand that various changes, substitutions and alterations can be made without departing from the scope of the present invention.

In accordance with an aspect of the embodiments, the ramp rate of the ramp generator can be increased to reduce the time penalty of extra ADC conversions, when a PGA is utilized. The benefit of a short correlated multi-sampling in the image sensor readout is even greater as the PGA provides greater flexibility to increase the ramp rate. While increasing the ramp rate will only effect the noise contribution per conversion from the ADC, that contribution is reduced by the gain from the PGA. The extra conversions, however, will provide a reduction in thermal noise from both the ADC and the PGA.

Figure 8:
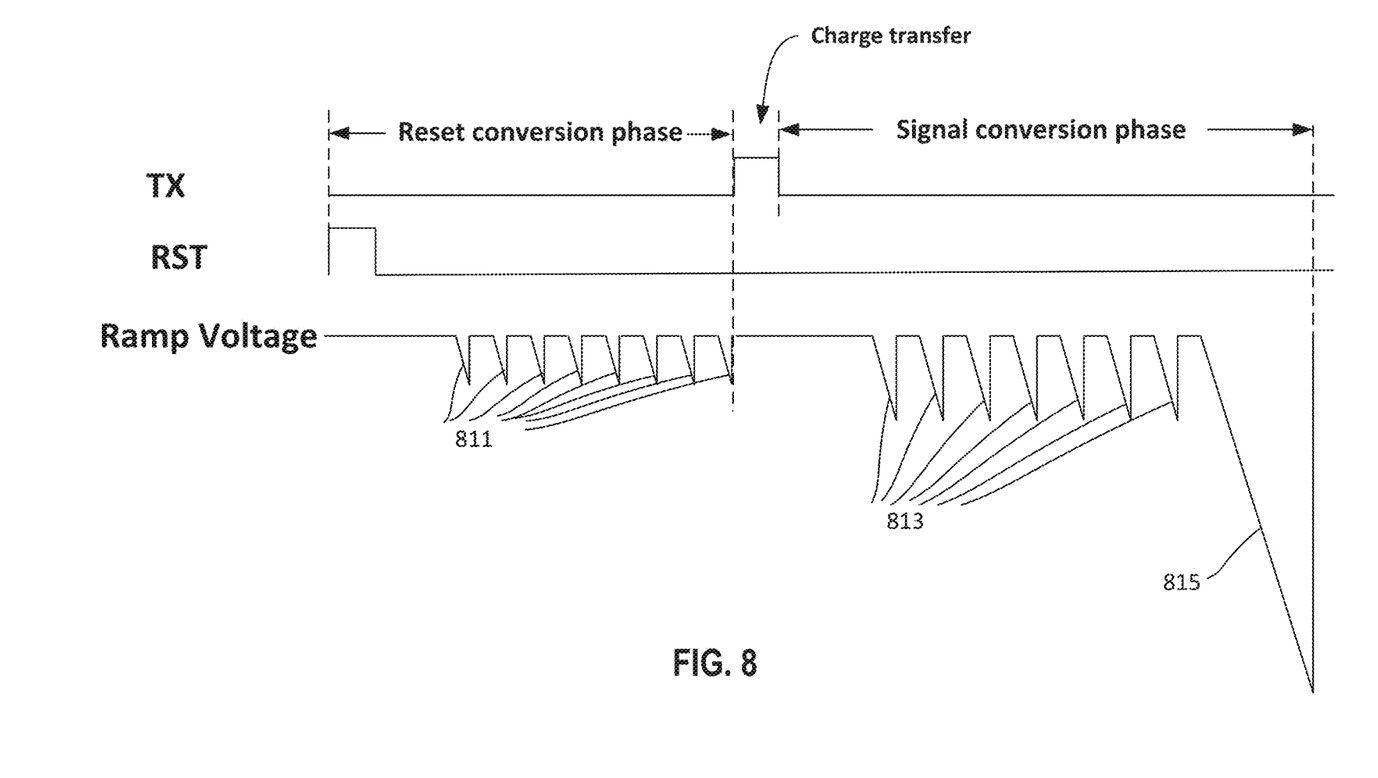
FIG. 8 is a timing diagram illustrating an exemplary pixel readout cycle of the readout circuit of FIG. 7 according to an embodiment of the present disclosure.

FIG. 8 is a timing diagram illustrating an exemplary pixel readout cycle of the readout circuit of FIG. 7 according to an embodiment of the present disclosure. Referring to FIG. 8, the pixel signal VOUT is applied to the input of the PGA, which scales the signal VOUT by a gain factor greater than 1 to a signal VOUTa. The controller adjusts the ramp rate of the first short ramps 811, the second ramps 813, and the third full-scale ramp 815 corresponding to the gain factor. For example, the PGA scales the pixel signal VOUT by a factor of 2, i.e., the controller enables an increase of the ramp rate of the first short ramps, the second short ramps and the full-scale ramp by the same factor. The benefit is then a noise level reduction to the readout circuit.

Figure 9:
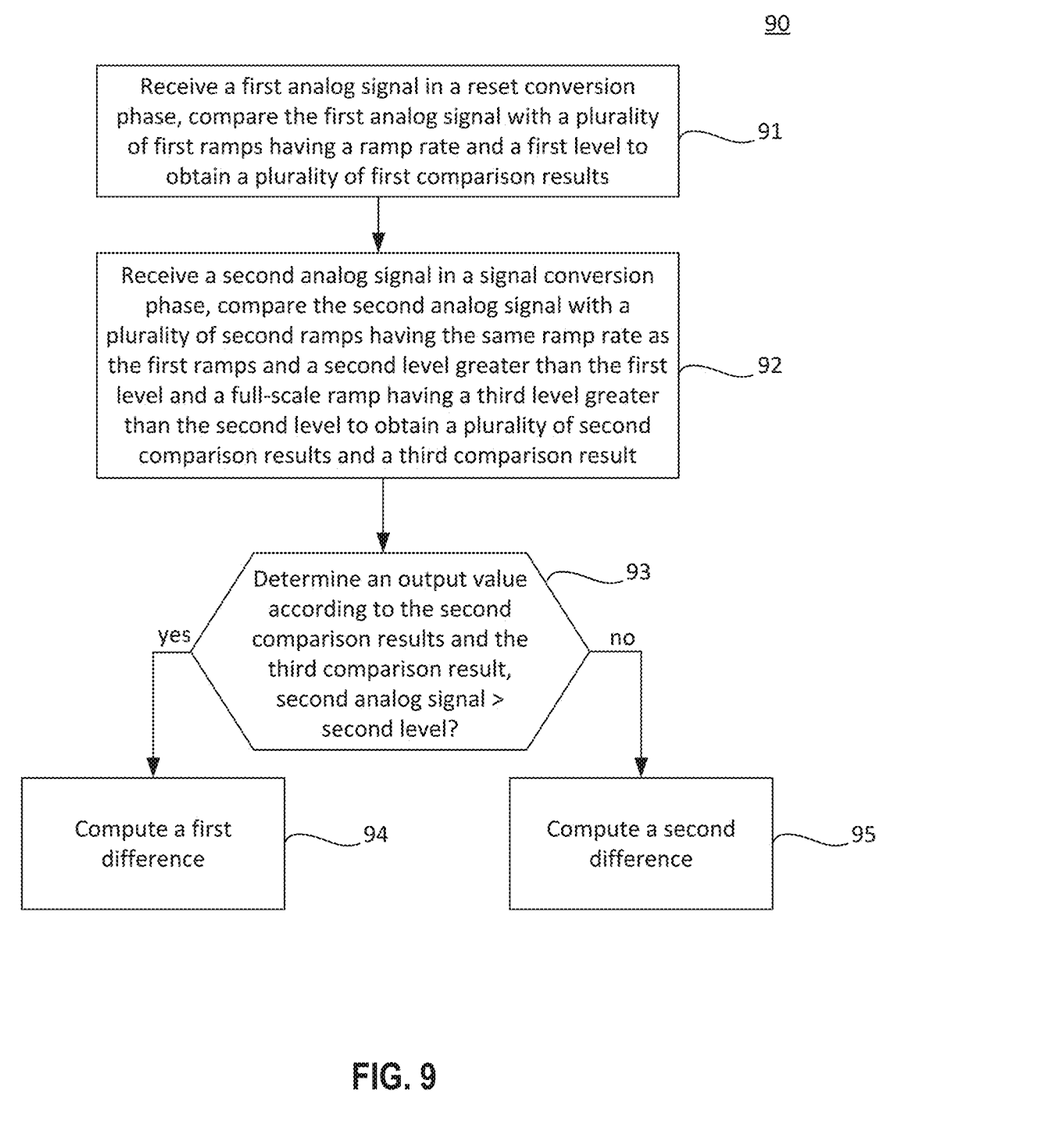
FIG. 9 is a simplified flowchart illustrating a method of operating an integrated-circuit image sensor according to an embodiment of the present disclosure.

FIG. 9 is a simplified flowchart illustrating a method 90 of operating an integrated-circuit image sensor according to an embodiment of the present disclosure. Referring to FIG. 9, the method 90 includes receiving (reading out) a first analog signal in a reset conversion phase and comparing the first analog signal with a plurality of first ramps having a same ramp rate and a first amplitude (level) to obtain a plurality of first comparison results, the first analog signal is indicative of a first charge of a floating diffusion node (of a pixel in a pixel array) in the reset conversion phase at step 91. The method 90 also includes receiving a second analog signal in a signal conversion phase and comparing the second analog signal with a plurality of second ramps having a second level greater than the first level and a full-scale ramp having a third level greater than the second level to obtain a plurality of second comparison results and a third comparison result, respectively, the second ramps and the full-scale ramp have the same ramp rate as the first ramps, and the second analog signal is indicative of a second charge of the floating diffusion node in the signal conversion phase (step 92). At step 93, the method 90 further includes determining an output signal value of the analog signal according to the second comparison results and the third comparison result. When the second analog signal is greater than the second level (yes in step 93), the method 80 includes determining that the second comparison results include a bright-level signal (e.g., the second charge of the floating diffusion node has more than 100 electrons), computing a first difference between the bright-level signal and a first average value of the first comparison results, and outputting the first difference as a first digital representation of the second analog signal (step 94). When the second analog signal is not greater than the second level (no in step 93), the method 90 includes determining that the second comparison results include a dark-level signal (e.g., the second charge of the floating diffusion node has fewer than 100 electrons), computing a second difference as a second digital representation of the second analog signal (step 95).

In one embodiment, the first and second comparison results and the third comparison result are obtained by a digital-to-analog converter having the structure shown and described in FIG. 2. As described above, the first, second, and third comparison results are obtained by counting a first number of reference clocks in each time interval of the first ramps and a second number of reference clocks in each time interval of the second ramps. The second ramps includes a number of ramps having a second level and at least one full-scale ramp having a third level greater than the second level. In one embodiment, the method 90 also includes storing the first, second, and third comparison results in a data storage for further processing, such as averaging and computing the difference. In one embodiment, the comparing and counting operations are performed sequentially using the same analog-to-digital converter for a pixel in a same column.

In one embodiment, the method 90 further includes amplifying (scaling) the first and second analog signals before performing the multiple ADC conversions in the reset conversion phase and in the signal conversion phase. By amplifying the first and second analog signals, the benefit and advantage of a short correlated multi-sampling operation is even greater as there is greater flexibility to increase the ramp rate and either obtain a fast overall conversion time or reduce the noise level contribution of the readout circuit when keeping the same conversion time.

According to an aspect of the inventive concept, the method includes terminating the second voltage ramps very early on in the signal conversion phase, e.g., only enough to convert signals representing a dark-level signal representing 100 or fewer electrons readout from a pixel photodiode. This results in a substantial savings of time for the extra ADC conversions and since one conversion still covers the full readout range of the pixel, there is no penalty in the dynamic range of the signal conversion. While increasing the ramp rate will only effect the noise contribution per conversion from the ADC, that contribution is reduced by the gain from the PGA. The extra conversions, however, will provide a reduction in thermal noise from both the ADC and the PGA.

In some embodiments, the steps described above may be performed by a controller or a processor that is integrated with the readout circuit. The controller may include one or more processing units, a memory (RAM, ROM, flash memory) coupled to the one or more processing units and including instructions for performing the steps, an input module for receiving user instructions, and output module for displaying an image of the pixel array.

In one embodiment, the controller may determine that the second analog signal is greater than the second level by evaluating the third comparison result. In one embodiment, the controller may determine that the second analog signal is greater than the second level through some indication that the count result for one of the short ramps in the signal conversion is invalid either by the fact that the ADC comparator never trips during the ramp time, the result is saturated, or the result exceeds some limit that should be considered valid for a given ramp duration.

In some embodiments, the controller may determine that the second analog signal is within a range of the second level or above a certain threshold of the second level, the controller may obtain the digital signal value of the second analog signal by computing an average of the second and third comparison results.

In other embodiments, the controller may determine the digital signal value of the second analog signal by multiplying the third comparison result with a number of first comparisons. This approach may be utilized when there is a gain change in the programmable gain amplifier.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto.

What is claimed is:

1. A readout circuit of an image sensor including a plurality of pixels, the readout circuit comprising:
    a ramp generator configured to generate a plurality of first short ramps having a first level in a reset conversion phase and a plurality of second short ramps having a second level greater than the first level and a full-scale ramp having a third level greater than the second level in a signal conversion phase;
    a comparator configured to:
        compare a first analog signal with each one of the first plurality of short ramps in the reset conversion phase to obtain a plurality of first comparison results; and
        compare a second analog signal with each one of the plurality of second short ramps and the full-scale ramp in the signal conversion phase to obtain a plurality of second comparison results and a third comparison result; and
    a controller configured to determine an output signal value of the second analog signal according to the plurality of second and third comparison results.

2. The readout circuit of claim 1, wherein the controller determines that the third comparison result comprises a bright-level signal when the second analog signal is greater than the second level, and the output signal value is associated with the bright-level signal.

3. The readout circuit of claim 1, wherein the controller determines that the plurality of second comparison results comprise a dark-level signal when the second analog signal is smaller than or equal to the second level, and the output signal value is associated with the dark-level signal.

4. The readout circuit of claim 1, further comprising a counter configured to digitize first time intervals of the plurality of first comparison results and second time intervals of the plurality of second comparison results, wherein each of the first time intervals is smaller than or equal to one of the second time intervals.

5. The readout circuit of claim 1, further comprising a programmable gain amplifier disposed in front of comparator and configured to reduce a noise level contribution of the readout circuit.

6. The readout circuit of claim 1, wherein the controller is further configured to compute an average of the first comparison results to obtain a first average comparison result and an average of the second and third comparison results to obtain a second average comparison result, the output signal value is associated with a difference between the second average comparison result and the first average comparison result when the second analog signal is smaller than or equal to the second level, and the output signal value is associated with a difference between the third comparison result and the first average comparison result when the second analog signal is greater than the second level.

7. An image sensor comprising:
a plurality of pixels arranged in a pixel array of rows and columns;
a ramp generator configured to generate a plurality of first short ramps having a first level in a reset conversion phase and a plurality of second short ramps having a second level greater than the first level and a full-scale ramp having a third level greater than the second level in a signal conversion phase;
a plurality of readout circuits each comprising a comparator configured to:
compare a first analog signal with each one of the first plurality of short ramps to obtain a plurality of first comparison results; and
compare a second analog signal with each one of the plurality of second short ramps and the full-scale ramp in the signal conversion phase to obtain a plurality of second comparison results and a third comparison result; and
a controller configured to determine an output signal value of the second analog signal according to the plurality of second comparison results and the third comparison result.

8. The image sensor of claim 7, wherein the controller determines that the third comparison result comprises a bright-level signal when the second analog signal is greater than the second level, and the output signal value is associated with the bright-level signal.

9. The image sensor of claim 7, wherein the controller determines that the plurality of second comparison results comprise a dark-level signal when the second analog signal is smaller than or equal to the second level, and the output signal value is associated with the dark-level signal.

10. The image sensor of claim 7, wherein each of the readout circuits further comprises a counter configured to digitize first time intervals of the plurality of first comparison results and second time intervals of the plurality of second comparison results, wherein the first time intervals each is smaller than one of the second time intervals.

11. The image sensor of claim 7, further comprising a programmable gain amplifier disposed in front of the comparator and configured to shorten a time period of the reset conversion phase and a time period of the signal conversion phase.

12. The image sensor of claim 7, wherein the controller is further configured to compute an average of the first comparison results to obtain a first average comparison result and an average of the second comparison results to obtain a second average comparison result, the output signal value is associated with a difference between the second average comparison result and the first average comparison result when the second analog signal is smaller than or equal to the second level, and the output signal value is associated with a difference between the third comparison result and the first average comparison result when the second analog signal is greater than the second level.

13. A method of operating an image sensor, the method comprising:
comparing a first analog signal with a plurality of first ramps having a first level, by a comparator, to obtain a plurality of first comparison results, the first analog signal indicative of a first charge of a pixel in a pixel array in a reset conversion phase;
comparing a second analog signal with a plurality of second ramps having a second level greater than the first level and a full-scale ramp having a third level greater than the second level, by the comparator, to obtain a plurality of second comparison results and a third comparison result, respectively, the second analog signal indicative of a second charge of the pixel in the pixel array in a signal conversion phase; and
determining an output signal value of the second analog signal according to the plurality of second comparison results and the third comparison result.

14. The method of claim 13, wherein determining the output signal value of the second analog signal according to the plurality of second comparison results comprises:
when the second analog signal is greater than the second level, determining that the plurality of second comparison results comprise a bright-level signal, the bright-level signal being associated with the output signal value; and
when the second analog signal is not greater than the second level, averaging the plurality of second comparison results to obtain a dark-level signal, the dark-level signal being associated with the output signal value.

15. The method of claim 14, further comprising:
averaging the plurality of first comparison results to obtain a first average value signal;
when the second analog signal is greater than the second level, computing a first difference between the bright-level signal and the first average value signal; and selecting the first difference as a representation of the second analog signal; and
when the second analog signal is not greater than the second level, computing a second difference between the dark-level signal and the first average value signal; and selecting the second difference as the representation of the second analog signal.

16. The method of claim 13, further comprising:
digitizing the plurality of first comparison results and the plurality of second comparison results.

17. The method of claim 16, wherein digitizing the plurality of first comparison results and the plurality of second comparison results comprising:

counting a first number of clocks in each first time interval of the plurality of first ramps by a counter, the first number of clocks being a first digital representation of one of the first comparison results; and counting a second number of clocks in each second time interval of the plurality of second ramps by the counter, the second number of clocks being a second digital representation of one of the second comparison results.

18. The method of claim 17, further comprising:

storing the plurality of first comparison results and the plurality of second comparison results in a data storage; and repeatedly resetting the counter after storing each of the plurality of first comparison results and each of the plurality of second comparison results.

19. The method of claim 13, further comprising:

amplifying the first analog signal and the second analog signal to shorten a time period of the reset conversion phase and a time period of the signal conversion phase.

20. The method of claim 13, wherein comparing the first analog signal with the plurality of first ramps in the reset conversion phase and comparing the second analog signal with the plurality of second ramps are performed sequentially.

* * * * *